United States Patent
Cochran

(10) Patent No.: US 10,855,106 B2
(45) Date of Patent: Dec. 1, 2020

(54) ENCLOSURE MONITORING DEVICES HAVING BATTERY BACKUP

(71) Applicant: HEWLETT PACKARD ENTERPRISE DEVELOPMENT LP, Houston, TX (US)

(72) Inventor: Charles W. Cochran, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 168 days.

(21) Appl. No.: 16/074,063

(22) PCT Filed: Jan. 28, 2016

(86) PCT No.: PCT/US2016/015477
§ 371 (c)(1),
(2) Date: Jul. 30, 2018

(87) PCT Pub. No.: WO2017/131722
PCT Pub. Date: Aug. 3, 2017

(65) Prior Publication Data
US 2019/0044372 A1 Feb. 7, 2019

(51) Int. Cl.
*H02J 9/06* (2006.01)
*H02J 7/00* (2006.01)
(Continued)

(52) U.S. Cl.
CPC ............ *H02J 9/061* (2013.01); *G06F 1/30* (2013.01); *H02J 7/0068* (2013.01); *H02J 7/34* (2013.01); *H05K 7/20781* (2013.01)

(58) Field of Classification Search
CPC .. H02J 9/061; H02J 7/0068; H02J 7/34; H02J 9/06; H02J 7/00; G06F 1/30; H05K 7/20781; H05K 7/20
See application file for complete search history.

(56) References Cited

U.S. PATENT DOCUMENTS

| | | | |
|---|---|---|---|
| 5,661,463 A * | 8/1997 | Letchak | G01R 31/3648 340/636.15 |
| 7,406,623 B2 | 7/2008 | Takahashi et al. | |

(Continued)

FOREIGN PATENT DOCUMENTS

| | | |
|---|---|---|
| EP | 1507327 A1 | 2/2005 |
| JP | 2010088211 A | 4/2010 |
| JP | 2014135881 A | 7/2014 |

OTHER PUBLICATIONS

Emerson Network Power, "DC Power Solutions for Core Applications," EN334BRA-Core, Jun. 22, 2015, pp. 1-8.
(Continued)

*Primary Examiner* — Robert L Deberadinis
(74) *Attorney, Agent, or Firm* — Dicke, Billig & Czaja, PLLC

(57) ABSTRACT

One example of a system includes a DC powered monitoring device and a battery backup power supply. The DC powered monitoring device is to monitor the status of an information technology (IT) enclosure environmental infrastructure. The monitoring device is to receive main DC power and backup DC power. The monitoring device is to operate using the backup DC power in response to a loss of the main DC power. The battery backup power supply is to provide the backup DC power to the monitoring device.

13 Claims, 4 Drawing Sheets

(51) Int. Cl.
*H05K 7/20* (2006.01)
*G06F 1/30* (2006.01)
*H02J 7/34* (2006.01)

(56) References Cited

U.S. PATENT DOCUMENTS

| | | |
|---|---|---|
| 7,675,740 B2 | 3/2010 | Rasmussen et al. |
| 2007/0132317 A1 | 6/2007 | Willets et al. |
| 2011/0016340 A1 | 1/2011 | Sun et al. |
| 2012/0134104 A1 | 5/2012 | Driggers |
| 2013/0099756 A1 | 4/2013 | Mohr et al. |
| 2015/0177808 A1 | 6/2015 | Sarti |

OTHER PUBLICATIONS

International Search Report and Written Opinion, International Application No. PCT/US2016/015477, dated Oct. 12, 2016, pp. 1-10, KIPO.

European Supplementary Search Report and Search Opinion Received for EP Application No. 16888452.6, dated Jul. 4, 2019, 8 pages.

\* cited by examiner

ENCLOSURE MONITORING DEVICES HAVING BATTERY BACKUP

BACKGROUND

A plurality of computing devices (e.g., servers), network switches, management controllers, management modules, power supplies, and cooling devices may be installed within an information technology (IT) enclosure. The power supplies may supply power to the other devices installed within the IT enclosure.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Monitoring equipment of an information technology (IT) enclosure environmental infrastructure should be able to report the status of the system even in the event of a power loss. If a monitoring device loses power, there is no way for the monitoring device to report the power loss event or the status of the system. Without backup power for the monitoring device, it cannot be determined whether the monitoring device has failed, lost communication, or lost power in the event of a power loss.

Alternating current (AC) power in a data center may range from 100V to 480V. The AC power should be de-energized in response to an emergency power off event. In addition, if present, high voltage direct current (HVDC) power should also be de-energized in response to an emergency power off event. Direct current (DC) voltages under 60V are considered safe to humans. Accordingly, as described herein, a DC powered monitoring device of an IT enclosure environmental infrastructure is powered by a battery backup power supply in the event of an AC power loss. The battery backup power supply provides a DC output voltage and does not include a DC to AC inverter, thus no AC voltages that could be harmful to humans are present during an emergency power off event. In addition, the battery of the backup power supply provides a longer run time during an AC power loss compared to backup power supplies using an inverter circuit.

Figure 1:
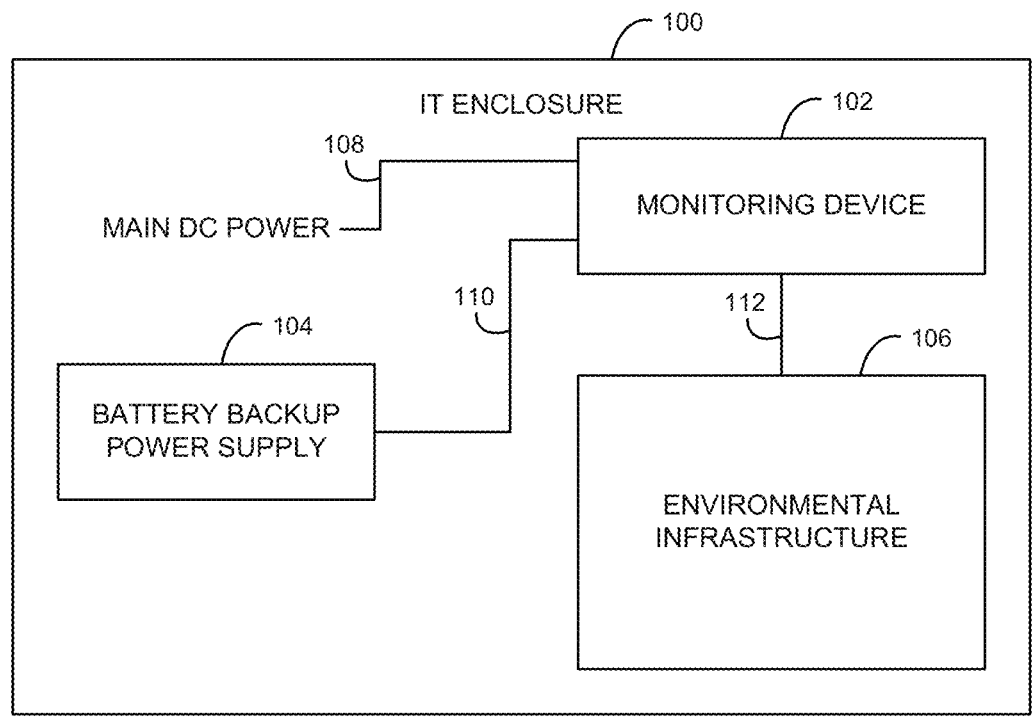
FIG. 1 is a block diagram illustrating one example of an information technology (IT) enclosure including a monitoring device.

FIG. 1 is a block diagram illustrating one example of an information technology (IT) enclosure 100. IT enclosure 100 includes a monitoring device 102, a battery backup power supply 104, and an environmental infrastructure 106. IT enclosure 100 may also include a server system including computing devices (e.g., servers), network switches, and/or other suitable IT devices (not shown). Monitoring device 102 receives main DC power through a power bus 108 and backup DC power from battery backup power supply 104 through a power bus 110. Monitoring device 102 is communicatively coupled to environmental infrastructure 106 through a signal path 112.

Environmental infrastructure 106 may include door locks, door status sensors, liquid cooling system valves, liquid leak detectors, temperature sensors, humidity sensors, dry contacts to control an upstream breaker shunt trip for emergency power off, and/or other devices and/or sensors for monitoring and controlling the environment within IT enclosure 100. Monitoring device 102 receives data from the various sensors of environmental infrastructure 106 and controls the various devices of environmental infrastructure 106 to ensure the proper operation of the server system within IT enclosure 100. Monitoring device 102 is powered by main DC power as long as main DC power is available. Monitoring device 102 is powered by backup DC power from battery backup power supply 104 in the event of a loss of the main DC power. The backup DC power may also power the devices and/or sensors of environmental infrastructure 106 in the event of a loss of the main DC power. Accordingly, in the event of a loss of the main DC power, monitoring device 102 may continue to monitor, log, and report the status of environmental infrastructure 106.

In one example, the main DC power is derived from AC power via an AC to DC converter (not shown). Battery backup power supply 104 provides backup DC power to monitoring device 102 and enables monitoring device 102 to report its status, the status of environmental infrastructure 106, and the status of a server system installed within IT enclosure 100 during an AC power loss, which results in the loss of the main DC power. The backup DC power may have a voltage less than 60V (e.g., 12V) so that the backup DC power is not harmful to humans.

Figure 2:
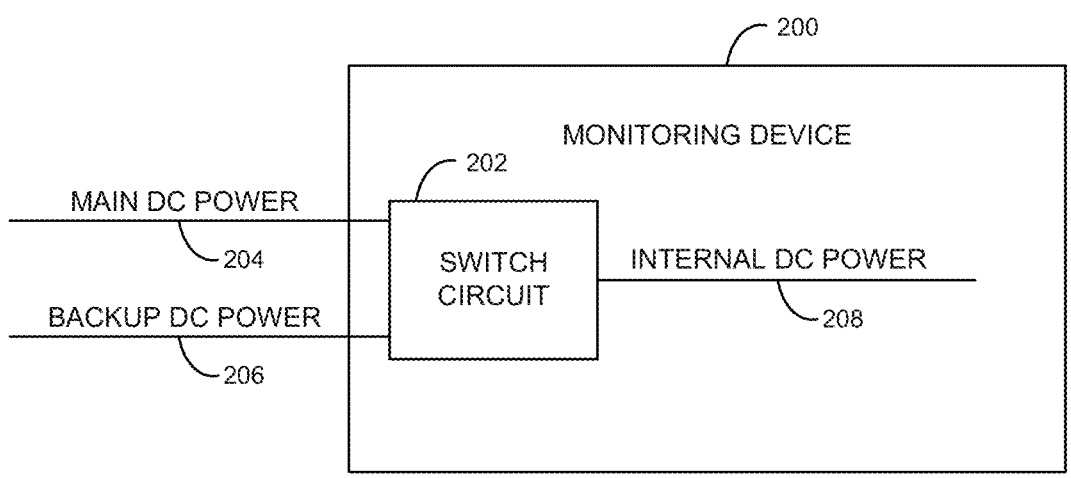
FIG. 2 is a block diagram illustrating one example of a monitoring device.

FIG. 2 is a block diagram illustrating one example of a monitoring device 200, such as monitoring device 102 previously described and illustrated with reference to FIG. 1. Monitoring device 200 includes a switch circuit 202. Switch circuit 202 receives main DC power on a power bus 204 and backup DC power on a power bus 206 to provide internal DC power on a power bus 208 to operate monitoring device 200. In one example, the main DC power is low voltage DC (LVDC) power having a voltage within the range between 12V and 60V. The backup DC power may have the same voltage as the main DC power.

In one example, switch circuit 202 monitors the main DC power and passes the main DC power to provide the internal DC power while the main DC power is within regulation limits. The regulation limits may define a voltage and current range within which the main DC power is suitable for powering monitoring device 200. In response to the main DC power falling outside the regulation limits, switch circuit 202 passes the backup DC power to provide the internal DC power. Switch circuit 202 may switch from passing the main DC power to passing the backup DC power to provide the internal DC power without interrupting the power provided to monitoring device 200 such that monitoring device 200 remains operational during the transition from main DC power to backup DC power. In one example, switch circuit 202 switches from passing the main DC power to passing the backup DC power to provide the internal DC power within 10 milliseconds of a failure of the main DC power.

Figure 3:
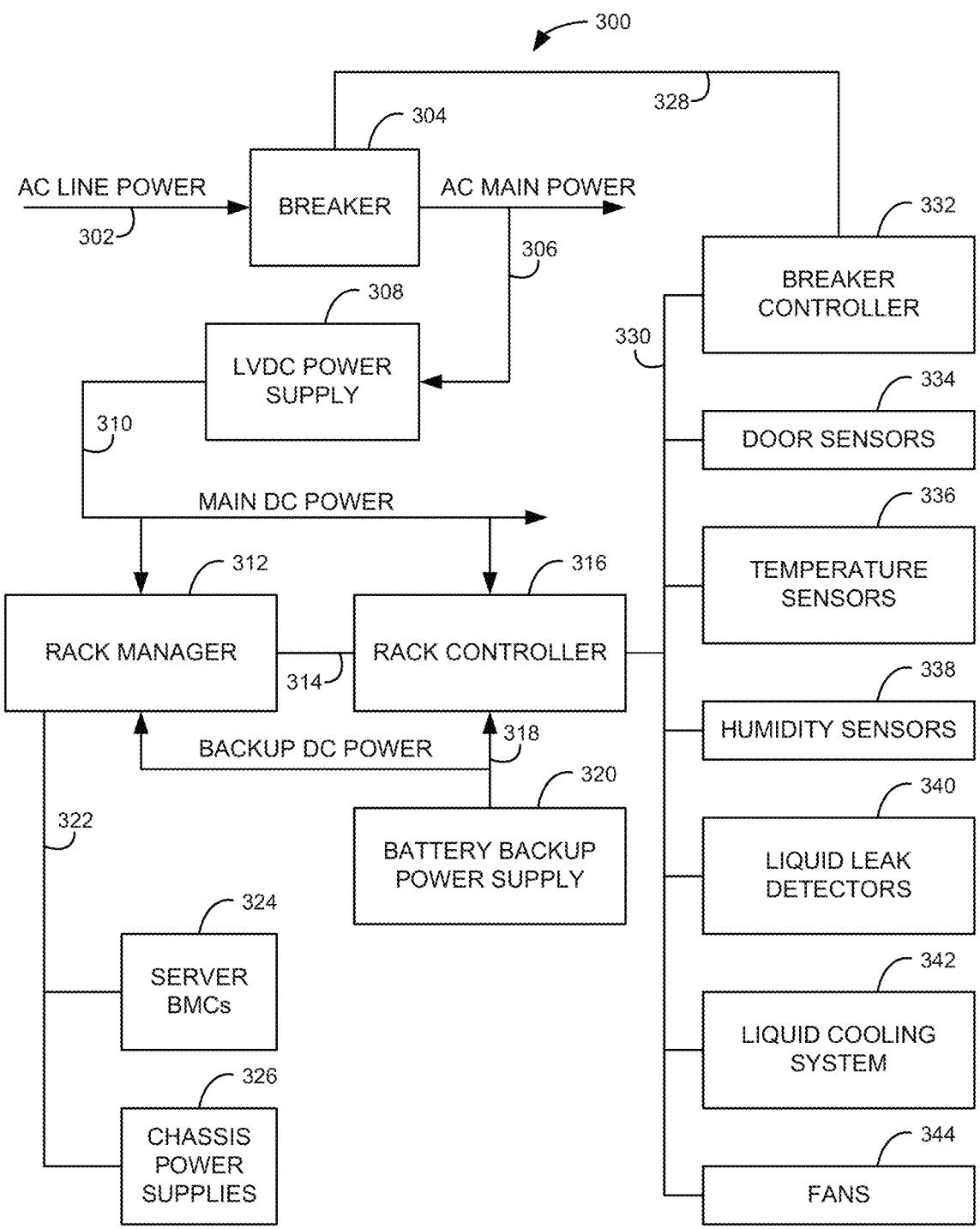
FIG. 3 is a block diagram illustrating one example of an IT enclosure environmental infrastructure.

FIG. 3 is a block diagram illustrating one example of an IT enclosure environmental infrastructure 300. IT enclosure environmental infrastructure 300 includes an AC power breaker 304, a LVDC power supply 308, a rack manager 312, a rack controller 316, and a battery backup power supply 320. In addition, IT enclosure environmental infrastructure 300 may include a breaker controller 332 (e.g., a shunt trip breaker), door sensors 334, temperature sensors 336, humidity sensors 338, liquid leak detectors 340, a liquid cooling system 342, and fans 344. In other examples, IT enclosure environmental infrastructure 300 may exclude some of the illustrated devices and/or include other devices, such as sensors, detectors, and environmental control systems. A server system installed in the IT enclosure includes server baseboard management controllers (BMCs) 324 and chassis power supplies 326. In one example, rack manager 312 and rack controller 316 may be integrated into a single device to provide a monitoring device, such as monitoring device 102 previously described and illustrated with reference to FIG. 1.

Breaker 304 receives AC line power through a power bus 302 to pass AC main power to power bus 306 when breaker 304 is closed. The AC main power is provided to LVDC power supply 308 and may be supplied to other devices (not shown) within the IT enclosure. LVDC power supply 308 converts the AC main power to provide main DC power on a power bus 310. The main DC power may have a voltage up to 60V, such as 12V, 24V, or 48V. The main DC power is received by rack manager 312 and rack controller 316 to operate rack manager 312 and rack controller 316 while main DC power is available. The main DC power may also be supplied to other devices (not shown) within the IT enclosure. Rack manager 312 and rack controller 316 receive backup DC power from battery backup power supply 320 through a power bus 318 in response to a loss of the main DC power. The backup DC power may also power door sensors 334, temperature sensors 336, humidity sensors 338, liquid leak detectors 340, liquid cooling system 342, and/or fans 344 in response to a loss of the main DC power. Accordingly, in response to a loss of the main DC power, rack controller 316 may continue to monitor, log, and report the status of environmental infrastructure 300.

Rack manager 312 is communicatively coupled to rack controller 316 through a signal path 314. Rack manager 312 sends settings and thresholds to rack controller 316 for IT environmental infrastructure 300 and receives status information from rack controller 316. Rack manager 312 is communicatively coupled to server BMCs 324 and chassis power supplies 326 through a signal path 322. While main DC power is available, rack manager 312 communicates with server BMCs 324 to control the power and power capping setting of the servers. Rack manager 312 also communicates with the chassis power supplies 326 to manage the power supplies and to monitor the status of the power supplies while main DC power is available. In response to a loss of the AC power and thus the main DC power, server BMCs 324 and chassis power supplies 326 may lose power. Rack manager 312 may communicate with a system manager (not shown) external to the IT enclosure to report the status of IT environmental infrastructure 300 to the system manager.

Rack controller 316 is communicatively coupled to breaker controller 332, door sensors 334, temperature sensors 336, humidity sensors 338, liquid leak detectors 340, liquid cooling system 342, and fans 344 through a signal path 330. Rack controller 316 communicates with liquid cooling system 342 and/or fans 344 to maintain operating temperatures of the IT enclosure within suitable limits. Liquid cooling system 342 may include valves and/or pumps controlled by rack controller 316 to maintain the temperature of liquid cooled servers installed in the IT enclosure within suitable limits.

Rack controller 316 communicates with breaker controller 332 to control breaker 304 through a signal path 328. Rack controller 316 communicates with door sensors 334, temperature sensors 336, humidity sensors 338, and liquid leak detectors 340 to determine the status of IT environmental infrastructure 300. In response to detecting a fault based on the status of at least one of the sensors and/or detectors, rack controller 316 controls breaker controller 332 to open breaker 304 to de-energize the AC power to the IT enclosure. Rack controller 316 may also de-energize HVDC power to the IT enclosure in response to detecting a fault. A fault may be detected, for example, due to a liquid leak from liquid cooling system 342, an over temperature, excessive humidity, an open door, or other sensor reading outside of acceptable limits within the IT enclosure that could result in damage to the system and/or be harmful or dangerous to a human.

In response to a loss of the AC power, whether due to a detected fault resulting in breaker 304 being opened or due to a loss of the AC line power, or in response to a loss of the main DC power due to a failure of LVDC power supply 308, rack manager 312 and rack controller 316 switch from operating using the main DC power to operating using the backup DC power. With rack manager 312 and rack controller 316 operating using backup DC power, rack controller 316 may communicate status information to rack manager 312, and rack manager 312 may communicate status information to the system manager. The status information may include a report indicating the reason (e.g., fault) for the power loss. In one example, once rack manager 312 sends the report to the system manager, rack manager 312 and rack controller 316 may disconnect from backup DC power supply 320.

Figure 4A:
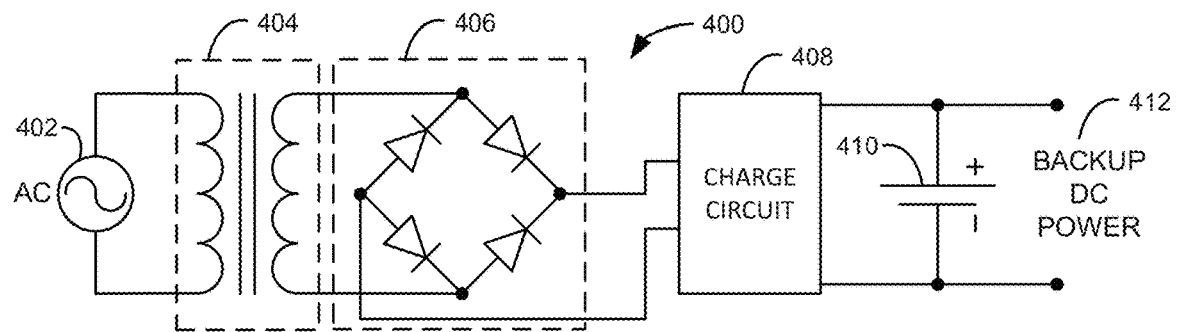
FIGS. 4A and 4B are schematic diagrams illustrating example battery backup power supplies.

FIG. 4A is a schematic diagram illustrating one example of a battery backup power supply 400. In one example, battery backup power supply 400 provides battery backup power supply 104 or 320 previously described and illustrated with reference to FIGS. 1 and 3, respectively. Battery backup power supply 400 includes an AC power source 402 (e.g., 120 VAC line power), a transformer 404, a rectifier 406, a charge circuit 408, and a battery 410. AC power source 402 is electrically coupled to the input of transformer 404. The output of transformer 404 is electrically coupled to the input of rectifier 406. The output of rectifier 406 is electrically coupled to a LVDC input of charge circuit 408. The output of charge circuit 408 is electrically coupled to battery 410. Battery 410 provides backup DC power as indicated at 412.

Transformer 404 and rectifier 406 convert the AC power from power source 402 to provide LVDC power to charge circuit 408. Charge circuit 408 controls the current provided to battery 410 to charge battery 410 and to maintain the charge of battery 410 while AC power source 402 is active.

Battery 410 provides battery backup DC power, which is used to operate the monitoring device in the event of an AC power loss and thus a main DC power loss.

Figure 4B:
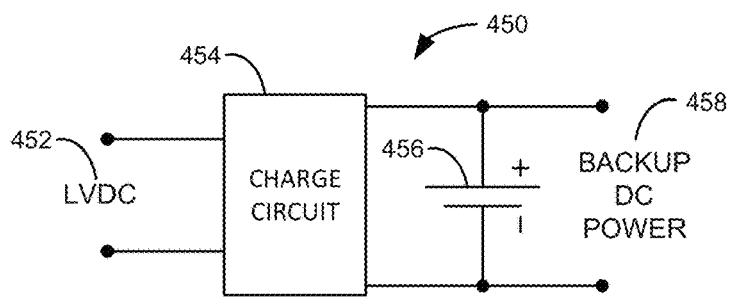

FIG. 4B is a schematic diagram illustrating another example of a battery backup power supply 450. In one example, battery backup power supply 450 provides battery backup power supply 104 or 320 previously described and illustrated with reference to FIGS. 1 and 3, respectively. Battery backup power supply 450 includes a charge circuit 454 and a battery 456. The input of charge circuit 454 is electrically coupled to a LVDC bus, such as main DC power bus 310 previously described and illustrated with reference to FIG. 3, to receive LVDC power as indicated at 452. The output of charge circuit 454 is electrically coupled to battery 456. Battery 456 provides backup DC power as indicated at 458. Charge circuit 454 controls the current provided to battery 456 to charge battery 456 and to maintain the charge of battery 456 while LVDC power is active. Battery 456 provides battery backup DC power, which is used to operate the monitoring device in the event of an AC power loss and thus a main DC power loss.

Figure 5:
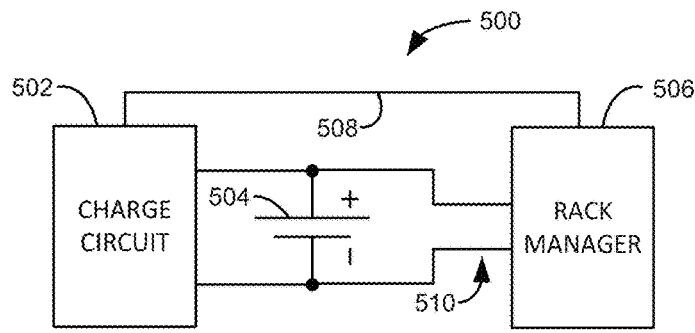
FIG. 5 is a schematic diagram illustrating one example of a battery backup power supply and a rack manager.

FIG. 5 is a schematic diagram illustrating one example of a battery backup power supply and a rack manager 506. The battery backup power supply includes a charge circuit 502 and a battery 504. Rack manager 506 is powered by battery 504 through a backup DC power bus 510 in the event of an AC power loss. Rack manager 506 is communicatively coupled to charge circuit 502 through a signal path 508. Rack manager 506 may communicate with charge circuit 502 through signal path 508 to control charge circuit 502 and to receive status information, such as the level of the charge of battery 504. Rack manager 506 may implement the functions of both rack manager 312 and rack controller 316 previously described and illustrated with reference to FIG. 3, such that a single monitoring device is used. In one example, the battery backup power supply including charge circuit 502 and battery 504 is a separate device from rack manager 506. In another example, charge circuit 502, battery 504, and rack manager 506 are integrated into a single device.

Figure 6:
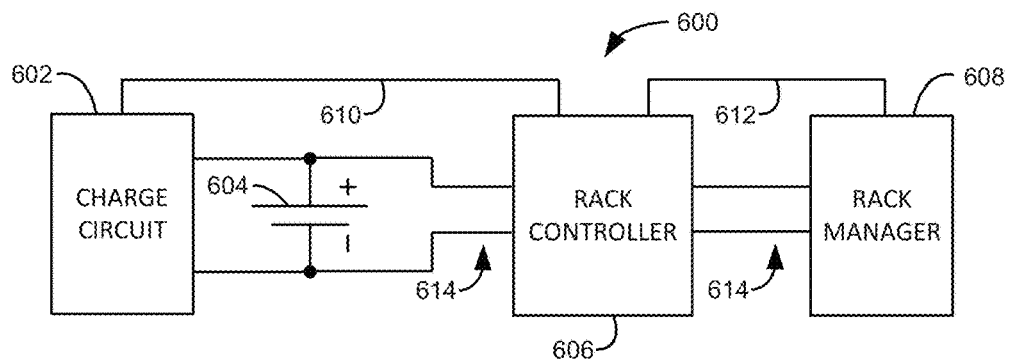
FIG. 6 is a schematic diagram illustrating one example of a battery backup power supply, a rack controller, and a rack manager.

FIG. 6 is a schematic diagram illustrating one example of a battery backup power supply, a rack controller 606, and a rack manager 608. The battery backup power supply includes a charge circuit 602 and a battery 604. Rack controller 606 and rack manager 608 are powered by battery 604 through a backup DC power bus 614 in the event of an AC power loss. Rack controller 606 is communicatively coupled to charge circuit 602 through a signal path 610 and to rack manager 608 through a signal path 612. Rack controller 606 communicates with charge circuit 602 through signal path 610 to control charge circuit 602 and to receive status information, such as the level of the charge of battery 604. Rack controller 606 communicates the status information and/or other information to rack manager 608 through signal path 612. Rack controller 606 and rack manager 608 may provide rack controller 316 and rack manager 312, respectively, as previously described and illustrated with reference to FIG. 3. In one example, the battery backup power supply including charge circuit 602 and battery 604 is a separate device from rack controller 606 and rack manager 608. In another example, charge circuit 602, battery 604, and rack controller 606 are integrated into a single device.

Figure 7:
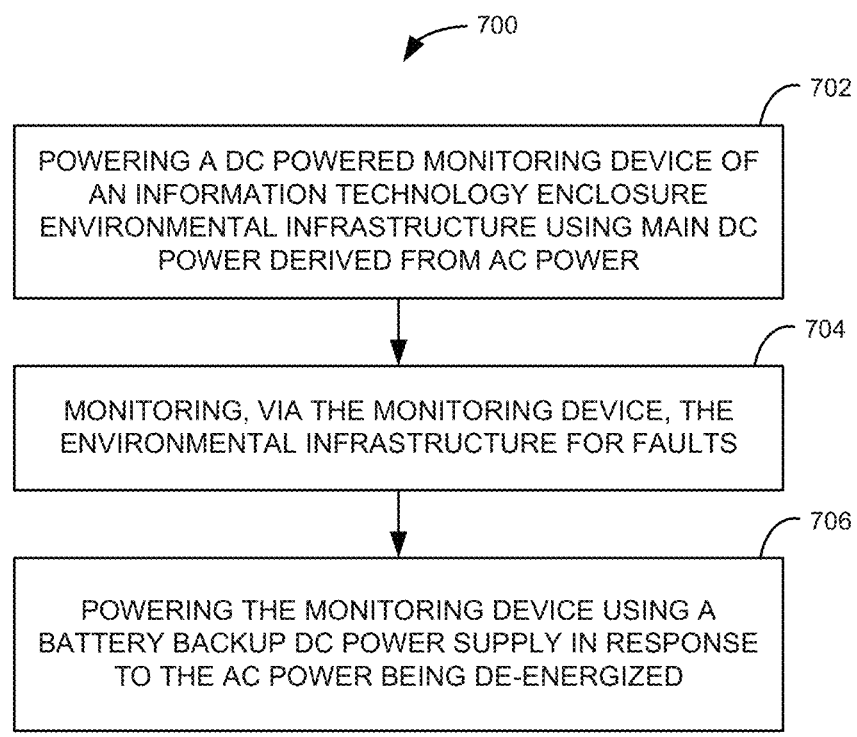
FIG. 7 is a flow diagram illustrating one example of a method for powering a monitoring device of an IT enclosure environmental infrastructure.

FIG. 7 is a flow diagram illustrating one example of a method 700 for powering a monitoring device of an IT enclosure environmental infrastructure. At 702, method 700 includes powering a DC powered monitoring device of an IT enclosure environmental infrastructure using main DC power derived from AC power. At 704, method 700 includes monitoring, via the monitoring device, the environmental infrastructure for faults. At 706, method 700 includes powering the monitoring device using a battery backup DC power supply in response to the AC power being de-energized.

In one example, method 700 includes powering the monitoring device using a battery backup DC power supply providing DC power having a voltage less than 60 VDC. Method 700 may further include reporting, via the monitoring device, detected faults of the environmental infrastructure. The AC power may be de-energized in response to detecting a fault of the environmental infrastructure. In one example, the AC power may be de-energized in response to detecting a liquid leak from a liquid cooling system of the IT enclosure.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
a direct current (DC) powered monitoring device to monitor the status of an information technology (IT) enclosure environmental infrastructure, the monitoring device receiving main DC power and backup DC power, and the monitoring device to operate using the backup DC power in response to a loss of the main DC power and de-energize AC power or high voltage direct current (HVDC) power input to the IT enclosure in response to detecting a fault; and
a battery backup power supply to provide the backup DC power to the monitoring device.

2. The system of claim 1, wherein the battery backup power supply comprises:
a low voltage direct current (LVDC) power input to receive LVDC power from an alternating current (AC) power supply or an IT enclosure LVDC bus;
a charge circuit to receive the LVDC power to provide a charging current; and
a battery to receive the charging current and to provide the backup DC power.

3. The system of claim 1, wherein the monitoring device comprises a rack controller to de-energize the AC power or high voltage direct current (HVDC) power input to the IT enclosure in response to detecting the fault.

4. The system of claim 1, wherein the monitoring device comprises a rack manager to report the status of the IT enclosure environmental infrastructure.

5. The system of claim 1, wherein the backup DC power has a voltage less than 60 VDC.

6. A system comprising:
a direct current (DC) powered rack controller to monitor the status of an environmental infrastructure of an information technology (IT) enclosure containing servers and a liquid cooling system for the servers and de-energize AC power to the IT enclosure in response to detecting a leak of liquid from the liquid cooling system, the rack controller receiving main DC power and backup DC power where the main DC power is derived from the AC power, and the rack controller to operate using the backup DC power in response to the AC power being de-energized; and a battery backup power supply to provide the backup DC power to the rack controller.

7. The system of claim 6, further comprising:

a DC powered rack manager to manage chassis power supplies of the IT enclosure and to communicate with baseboard management controllers (BMCs) of the servers to control server power, the rack manager receiving main DC power and backup DC power, and the rack manager to operate using the backup DC power in response to the AC power being de-energized, wherein the chassis power supplies and the BMCs lose power in response to the AC power being de-energized, and wherein sensors of the environmental infrastructure operate using the backup DC power in response to the AC power being de-energized.

8. The system of claim 6, wherein the rack controller comprises a circuit to switch from operating using main DC power to operating using backup DC power in response to the AC power being de-energized.

9. The system of claim 6, wherein the battery backup power supply comprises:

a low voltage direct current (LVDC) power input to receive LVDC power from an AC power supply or a LVDC bus of the IT enclosure;

a charge circuit electrically coupled to the LVDC power input; and a battery electrically coupled to the charge circuit to provide the backup DC power.

10. A method comprising:

powering a direct current (DC) powered monitoring device of an information technology (IT) enclosure environmental infrastructure using main DC power derived from alternating current (AC) power;

monitoring, via the monitoring device, the environmental infrastructure for faults;

de-energizing the AC power in response to detecting a fault of the environmental infrastructure; and powering the monitoring device using a battery backup DC power supply in response to the AC power being de-energized.

11. The method of claim 10, comprising powering the monitoring device using a battery backup DC power supply providing DC power having a voltage less than 60 VDC.

12. The method of claim 10, further comprising:

reporting, via the monitoring device, detected faults of the environmental infrastructure.

13. The method of claim 10, further comprising:

de-energizing the AC power in response to detecting a liquid leak from a liquid cooling system of the IT enclosure.

* * * * *